(12) United States Patent
Klein et al.

(10) Patent No.: US 7,196,587 B2
(45) Date of Patent: Mar. 27, 2007

(54) WAVEFORM LINEARISER

(75) Inventors: Robert H Klein, Stevenage (GB); Peter Justin, Stanmore (GB)

(73) Assignee: MBDA UK Limited, Stevenage (GB)

( * ) Notice: Subject to any disclaimer, the term of this patent is extended or adjusted under 35 U.S.C. 154(b) by 0 days.

(21) Appl. No.: 10/523,713

(22) PCT Filed: Jul. 29, 2003

(86) PCT No.: PCT/GB03/03221

§ 371 (c)(1),
(2), (4) Date: Feb. 7, 2005

(87) PCT Pub. No.: WO2004/013969

PCT Pub. Date: Feb. 12, 2004

(65) Prior Publication Data

US 2006/0164173 A1    Jul. 27, 2006

(30) Foreign Application Priority Data

Aug. 6, 2002    (GB) ................ 0218166.7

(51) Int. Cl.
*H03L 7/00*    (2006.01)
(52) U.S. Cl. .................. 331/16; 331/1 A; 331/34; 331/177 R
(58) Field of Classification Search ........... 331/16, 331/25, 177 R, 34, 1 A
See application file for complete search history.

(56) References Cited

U.S. PATENT DOCUMENTS

| | | | |
|---|---|---|---|
| 4,308,508 A | 12/1981 | Sommer et al. | 332/128 |
| 5,374,903 A | 12/1994 | Blanton | 331/4 |
| 5,642,081 A | 6/1997 | Bosch et al. | 331/4 |
| 5,983,077 A | 11/1999 | Dent | 455/44 |
| 6,091,356 A | 7/2000 | Sanders et al. | 342/132 |

FOREIGN PATENT DOCUMENTS

| | | |
|---|---|---|
| EP | 0 423 941 | 4/1991 |
| GB | 1 374 638 | 11/1974 |
| GB | 2 231 737 | 11/1990 |
| GB | 2 236 026 | 3/1991 |
| GB | 2 246 042 | 1/1992 |
| GB | 2 258 354 | 2/1993 |

OTHER PUBLICATIONS

B. Goldberg, "Linear Frequency Modulation—Theory and Practice" *RF Design*, Sep. 1993, pp. 39-46.

*Primary Examiner*—Arnold Kinkead
(74) *Attorney, Agent, or Firm*—Nixon & Vanderhye P.C.

(57) ABSTRACT

An improved apparatus and method of generating swept frequency waveforms in the field of digital lineariser technology, using a phase-locked loop frequency synthesiser, is provided.

Preferably, a ramp generator 120 is used to apply a modulation signal to the frequency control input of a voltage controlled oscillator via a summer component 110. A direct digital synthesis (DDS) reference component 400 is used to controllably produce a progressive shift in threshold crossing points of the signal (on line 144) such as to compensate for the ramp signals generated by the generator 120 which is compared with the signal (on line 146) from the reference frequency source (line 140).

Advantageously, the proposed apparatus/method finds utility in various FM CW-based radar applications.

12 Claims, 4 Drawing Sheets

Fig 3

WAVEFORM LINEARISER

This application is the US national phase of international application PCT/GB2003/003221 filed 29 Jul. 2003 which designated the U.S. and claims benefit of GB00218166.7, dated 6 Aug. 2002, the entire content of which is hereby incorporated by reference.

BACKGROUND OF THE INVENTION

1. Field of the Invention

This invention relates to digital linearisers for linearising swept frequency waveforms. It particularly, but not exclusively, relates to such waveforms for use in an FMCW radar.

2. Discussion of Prior Art

Digital frequency synthesisers utilising phase-locked loops are well-known in the art of frequency synthesis. Such frequency synthesisers generate highly accurate signals at regularly-spaced discrete frequencies. While a stepwise approximation to a swept waveform can be attained by progressively incrementing or decrementing through the frequency steps, the fact that frequency changes can only occur as discrete steps means that there will in general be a discrepancy between the waveform achievable in practice and an ideal FMCW waveform.

One known technique for decreasing step size is to use a variable modulus counter in conjunction with a conventional variable divider. Such an arrangement is shown in FIG. 1. A stable reference frequency $f_1$ on line 11 from a reference frequency oscillator 1 is applied to a first input of a frequency/phase discriminator 2. The discriminator output on line 12 is passed through a loop filter 3 which both introduces the necessary phase shift required for loop stability and removes AC components from the discriminator output, thereby supplying a DC voltage on line 13 to a frequency control input of a voltage controlled oscillator (VCO) 4. The VCO output frequency is fed via line 14 to a variable modulus divider 6. The divider output on line 16 is fed to a programmable divider 5 whose output signal at frequency $f_2$ is applied via line 15 to a second input of discriminator 2.

The variable modulus divider is switchable between two different division ratios such as 10 and 11 or 31 and 32, and in use is repetitively switched between its two states. Varying the ratio of time spent in each state allows smaller frequency steps to be obtained than if only the programmable divider were used.

Such an arrangement might be thought to be suitable for the production of swept frequencies, as the inherent quantisation error due to the use of discrete frequencies can in principle be made arbitrarily small by appropriately controlling the effective division ratio using dividers 5 and 6.

However, progressively decreasing the frequency step size requires the provision of a loop filter having a progressively longer time constant, making it impossible to generate rapidly-changing swept waveforms.

Attempting to generate swept waveforms by applying modulation to the frequency control input of the VCO will result in the generation of a swept frequency $f_2$ which will of course be different from reference frequency $f_1$. Within a $2\Pi$ window, discriminator 2 will view the progressive change of frequency $f_2$ as a progressively-changing phase error. Discriminator 2 will attempt to correct this perceived phase error, thereby tending to cancel out the modulation. Increasing the loop filter time constant to overcome this will result in unacceptably long response times when changing frequency ranges.

SUMMARY OF THE INVENTION

The present invention aims to overcome or at least substantially reduce some of the above-mentioned drawbacks.

The present invention seeks to provide an improved apparatus and method of generating swept frequency waveforms.

A first aspect of the invention provides a swept frequency source comprising a phase-locked loop frequency synthesiser, the phase-locked loop including: a voltage controlled oscillator; means for generating a first swept waveform; means for modulating the voltage-controlled oscillator with the first swept frequency waveform; a reference frequency source; frequency/phase discriminator means for generating an output voltage for controlling the voltage-controlled oscillator, the frequency/phase discriminator means having a first input for receiving an input from the reference frequency source and a second input; means to generate a first control signal whose frequency is in a predetermined relationship to the instantaneous output frequency of the voltage-controlled oscillator; neutraliser means comprising an input for receiving the first control signal; second sweep waveform means for generating a second sweep waveform corresponding with the first sweep waveform; means responsive to the first control signals and the second sweep waveform to generate a second control signal whose level traverses a signal threshold at instants of time at which the first control signal would have crossed a corresponding threshold had no modulation been applied to the voltage controlled oscillator; and means to apply the second control signals to the second input of the frequency/phase discriminator means.

A second aspect of the invention provides a method of generating a swept frequency using a phase-locked loop frequency synthesiser comprising the steps of providing a phase-locked loop comprising a reference frequency source, a frequency/phase discriminator, a voltage controlled oscillator, a first control signal whose frequency has a predetermined relationship to the output frequency of the voltage controlled oscillator; modulating the voltage controlled oscillator output frequency with a first modulating waveform, using the first control signal and a second modulating waveform corresponding with the first modulating waveform to produce a second control signal whose instantaneous amplitude traverses a predetermined threshold level at instants of time corresponding to the instants of time at which the first control signal would cross a corresponding threshold level if no modulating waveform were present; comparing the second control signal with the output signal of reference frequency source in the frequency/phase discriminator; and utilising frequency/phase discriminator output to control the voltage controlled oscillator.

DETAILED DISCUSSION OF THE DRAWINGS

An embodiment of the invention will now be described by way of non-limiting example only with reference to the drawings in which FIG. 1 shows a prior art frequency synthesiser;

DETAILED DISCUSSION OF EMBODIMENTS

Figure 1:
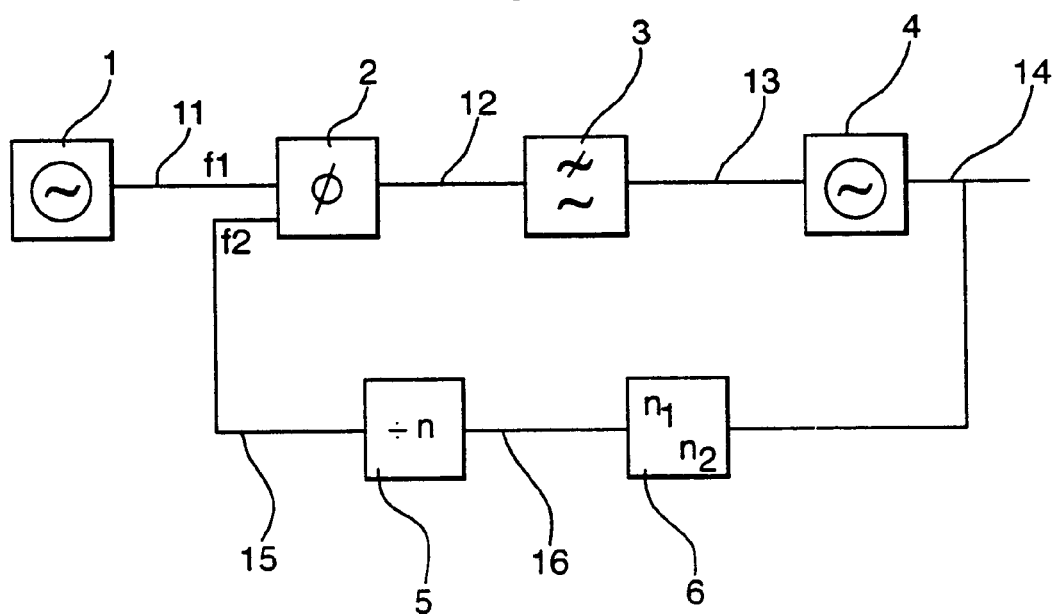
Figure 2:
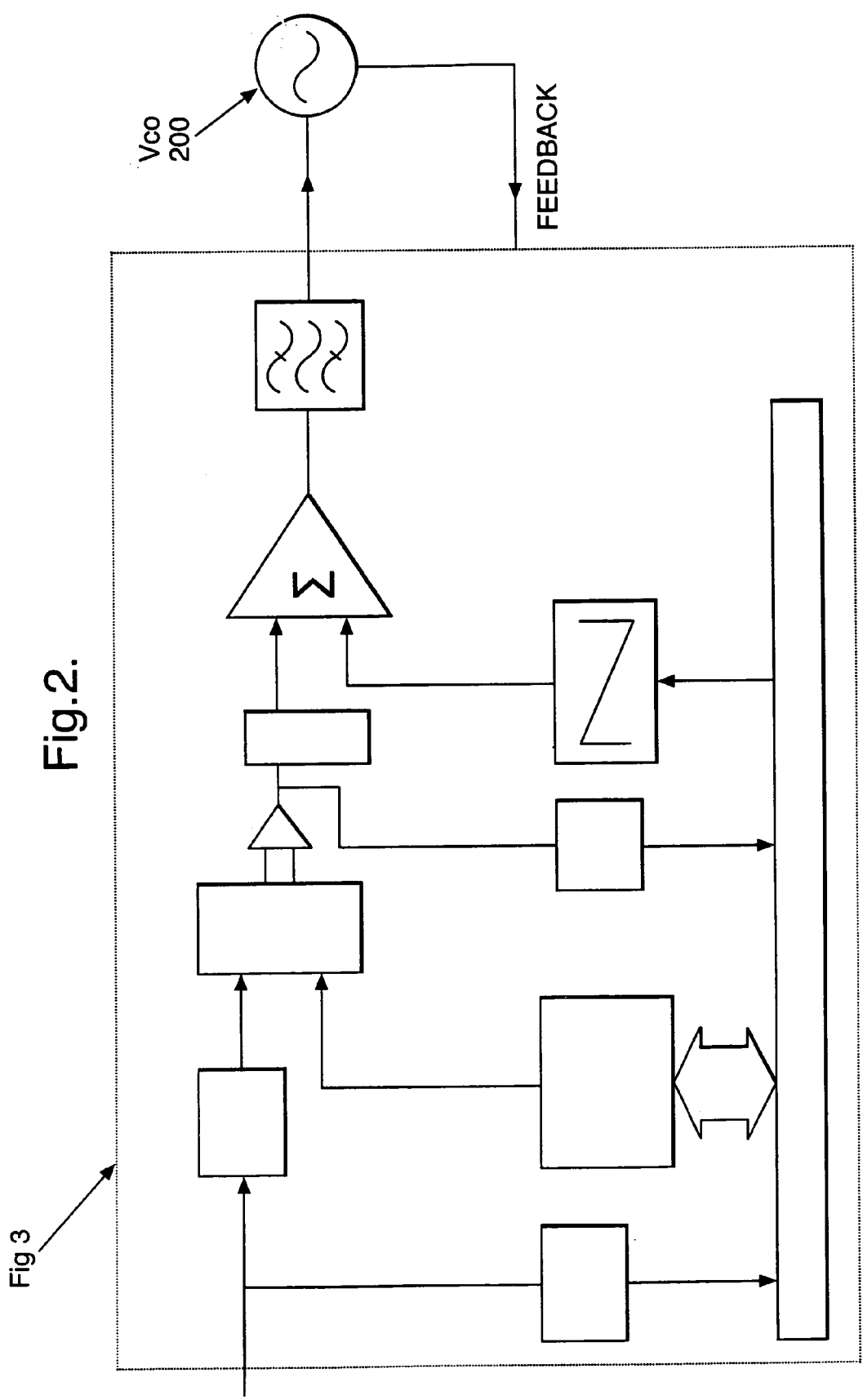
FIG. 2 shows a block diagram of a frequency synthesiser embodying the invention.
Figure 3:
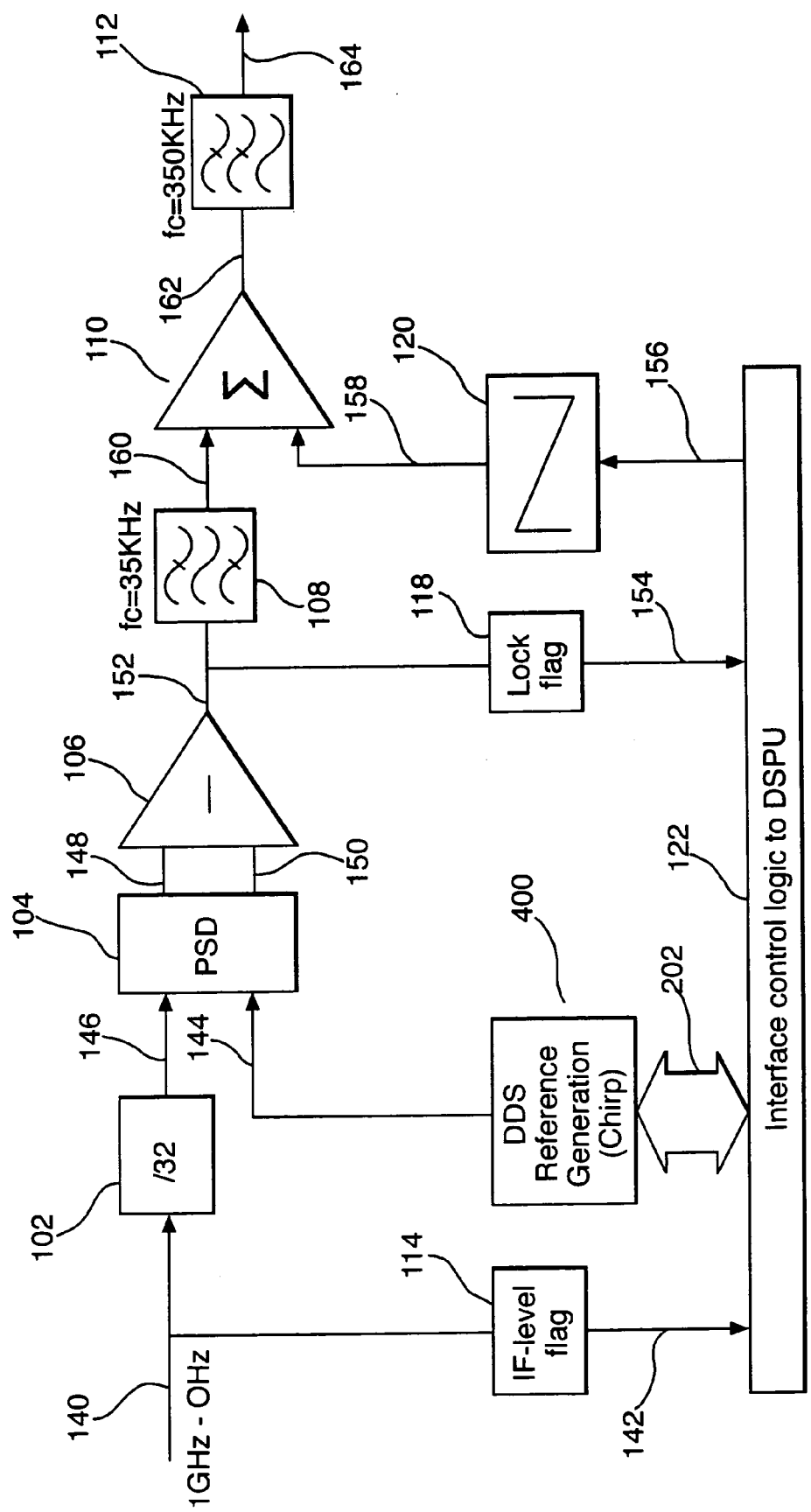
FIG. 3 shows a part of FIG. 2 in greater detail.

Referring to FIGS. 2 and 3, a lineariser intermediate frequency (IF) signal, which in the present embodiment can lie in the range 0 to 1 GHz, on line 140 is applied to the input of a divide-by-32 block 102 and to the input of an IF-level flag circuit 114 whose output is fed via line 142 to an interface control logic block 122. The output of divide-by-32 block 102 is fed via line 146 to a first input of a phases-sensitive detector (PSD) 104. A bi-directional bus 202 couples the interface control logic 122 and a Direct Digital Synthesis (DDS) reference block 400 which will be described later with reference to FIG. 2. An output of DDS reference block 400 is fed via line 144 to a second input of PSD 104. First and second outputs from PSD 104 are fed via lines 148, 150 to respective inputs of a differential amplifier 106 whose output is fed via line 152 to a lock flag circuit 118 and a loop filter 108 which in the present embodiment has a cut-off frequency of 35 kHz.

The filtered output signal on line 160 is fed to a first input of a summation amplifier 110. Signals from interface control logic 122 are fed via line 156 to a ramp generator circuit 120 whose output is fed via line 158 to a second input of summation amplifier 110. The summed output is fed via line 162 to a low-pass varactor filter 112 having a cut-off frequency fc of 350 kHz. In the present embodiment filter 112 is a passive Cauer filter. The output of the filter on line 164 is fed to the frequency control input of a voltage-controlled oscillator 200.

Figure 4:
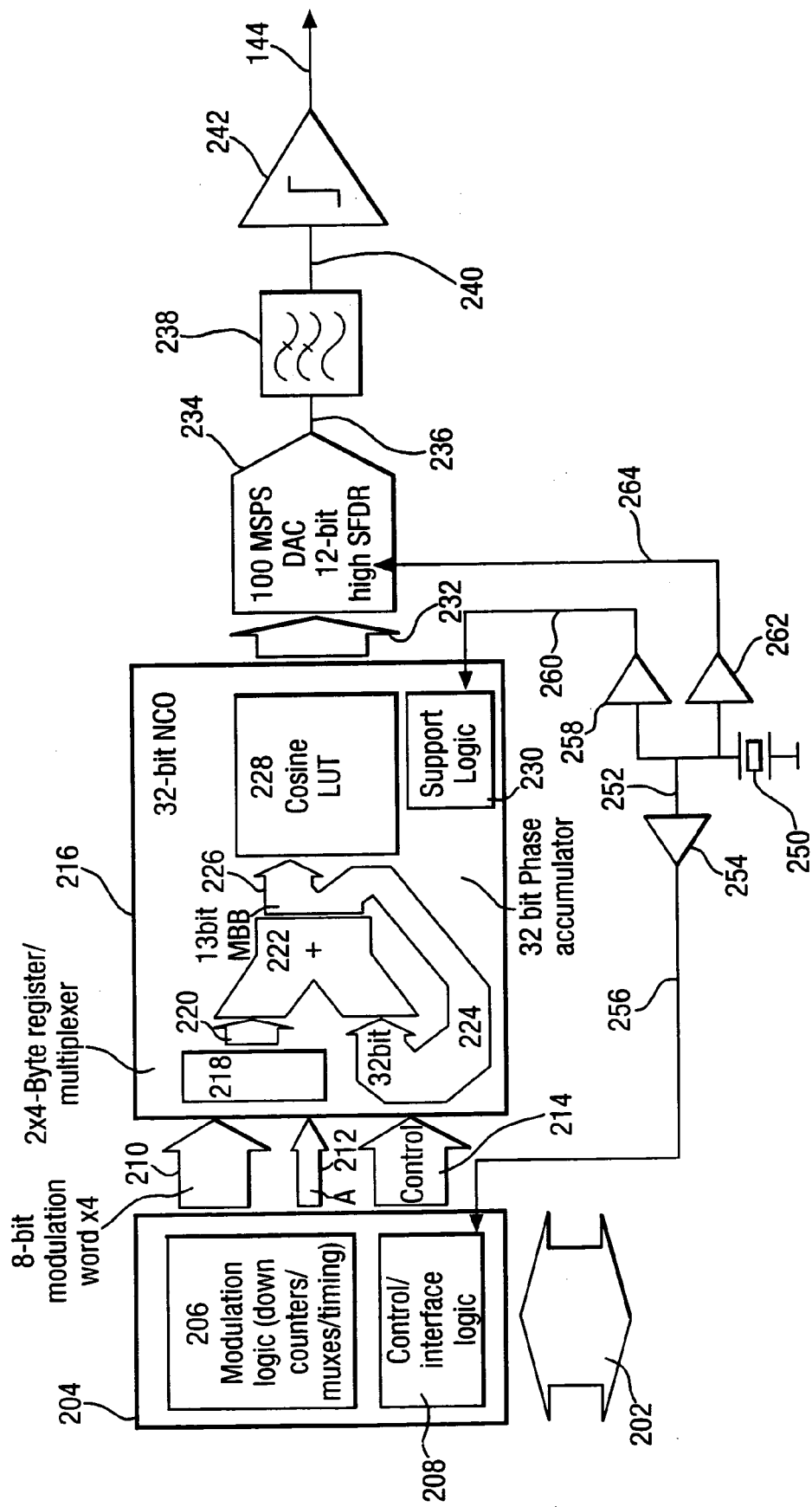
FIG. 4 shows a part of FIG. 3 in greater detail.

Referring now to FIG. 4, control interface logic 208 provides an interface via bi-directional bus 202 between the interface control logic 122 (as shown in FIG. 3) and modulation logic 206 and, via control bus 214, a 32 bit numerically controlled oscillator (NCO) 216. The modulation logic 206 contains down counters, multiplexers and timing circuits. Operation of NCO 216 is controlled by clocked support logic 230. An 8-bit bus 210 conveys modulation words as four sequential 8-bit words, and a bus A 212 convey signals to a 2×4 Byte register/multiplexer 218 which converts the 4×8 byte words to 32 bit (8 byte) words which are applied via a 32 bit bus 220 to a first input of a 32 bit adder 222. The output of adder 222 is a 32 bit word which is fed back via 32 bit bus 224 to a second input of adder 222. The adder 222 and feed back path 224 constitute a 32 bit phase accumulator. The 13 most significant bits of the adder output are fed via 13-bit bus 226 to a cosine look-up table (LUT) 228. The output of the look-up table (LUT) 228 is fed via bus 232 to a 12 bit Digital-to-Analogue converter (DAC) 234 which produces an analogue output signal on line 236. This signal is filtered in low-pass filter 238. The filtered analogue signal is fed via line 240 to a circuit 242 which produces a digital output at emitter-coupled logic (ECL) levels on line 144. A crystal oscillator 250 generates clock signals on line 252 which are fed via respective buffer amplifiers 254, 258, 262 and lines 256, 260, 264 to the control interface logic 208, support logic 230 and 12 bit DAC 234 respectively.

The functions of the individual blocks will be now be described.

The modulation and interface logic 204 produces a 23 bit-modulation word which decrements at a $2^N$ fraction of the master clock frequency as determined by oscillator 250. Each 32 bit-word is output on 8-bit bus 210 as four sequential 8-bit words. In the present embodiment which requires a linear ramp frequency modulation waveform, a start count of $\Delta_{phase(start)}$ is loaded at every ramp reset, resulting in a ramp FM modulation. In principle, any arbitrary waveform could be substituted for the linear ramp according to the requirement of the system. A linear ramp is used in the present embodiment because a linearly-ramping frequency characteristic is required.

The numerically controlled oscillator 216 receives 32 bit-modulation words from the modulation logic 204 at one quarter of the master clock frequency as a consequence of the 32-bit word being conveyed in four×8 bit sections.

The modulation word is phase-accumulated by means of the feedback path 224 so that the 13 bit output word on bus 226 represents the real time phase of the oscillator signal to be generated. This 13 bit word is then passed to the sine/cosine look-up table to generate the 12-bit numeric oscillator signal which is a digital representation of the instantaneous amplitude of the desired oscillator output signal. The numeric oscillator signal is converted to an analogue signal in DAC 234 whose output is updated at the frequency of the master clock 250.

The modulation word $\Delta_{phase}$ on bus 220 effectively directly sets the frequency of the analogue sinusoid emerging from DAC 234 in accordance with the equation $$f_0 = (f_c \times \Delta_{phase})/2^{32}$$

where $f_0$ is the NCO output frequency on line 236, $f_c$ is the clock frequency of master clock 250, and $\Delta_{phase}$ is the decimal value for the 32-bit modulation word on bus 220.

DAC 234, which converts the NCO word on bus 232 to an analogue signal on line 236, has the following requirements:
 i low glitch energy,
 ii low spurious-free dynamic range,
 iii low differential non-linear performance, and
 iv low integral non-linear performance.

DAC 234 determines the Phase Modulation (PM) noise performance of the radar baseband Intermediate frequency (IF), the IF being determined from a homodyne mix of transmitted and target returned signals at the antenna.

Filter 238, which removes all the digitally-generated alias components, is a high roll-off low-pass filter having sufficient stop-band attenuation at the alias frequency (half the master clock frequency) to reduce it to a negligible level.

The sine to ECL converter 242 conveniently detects the zero crossing point of the filtered sinusoid on line 240 and translates this into rising and falling transitions of ECL-level logic signals. The fast response time of ECL logic is conveniently used to ensure that the converter produces minimal skew, as skew translates directly into PM noise on the baseband IF frequency.

The phase frequency sensitive detector 104 of FIG. 3 utilises a dual flip-flop NOR gate architecture known per se and is laser trimmed to ensure that the output signals on line 152 exhibit zero dead time. The two outputs 148 and 150 consist of pulse trains, the delay between the respective logic transitions thereof being proportional to the phase difference between the signal on line 144 and the prescaled lineariser IF signals on line 146. The output form differential amplifier 106 is a variable mark-space signal whose DC component is proportional to the phase difference between the output frequency determined by NCO 216 and the prescaled lineariser IF signals on line 146 up to a phase difference of 2Π. As is known to those skilled in the art, this type of PSD is capable of distinguishing differences in frequency and generates a dc voltage component which is a function of the frequency slip between the prescaled lineariser IF on line 146 and the anti-aliased NCO signal on line 144.

For small frequency slips a coarse correction is generated by the difference between respective widths of the "mark" and the "space" parts of the waveform. For large frequency differences the correction saturates to a fixed voltage (either logic "1" or logic "0" according to whether one frequency is higher or lower than the other). This gives the phase lock loop a very wide pull-in capability in conjunction with a very low PM noise capability. When the loop is phase locked, zero corrections are generated as there is zero error to correct. The lineariser IF prescaler is a divide-by-N which enables the loop to lock to a lineariser IF of N×$f_0$ where $f_0$ is the NCO frequency. In the present embodiment N=32 but any other value can of course be used according to designed requirements in the usual manner.

The loop filter 108 of FIG. 3 is a conventional loop filter for limiting correction bandwidth and setting the damping factor of the loop for optimal noise performance. In the present embodiment it is critically damped and has a cut-off frequency of 35 kHz. The summation amplifier 110 sums together the filtered correction signal on line 160 with the offset and open loop ramp voltage on line 158. The varactor filter 112 limits semiconductor noise and prevents higher frequency modulation of the varactor which would otherwise generate noise floor lift on baseband IF. The roll-off is about 10 times the loop bandwidth. The filter has a low in-band phase lag to ensure phase lock-up.

Having thus described the present invention by reference to a preferred embodiment, it is to be appreciated that the embodiment is in all respects exemplary and that modifications and variations are possible without departure from the spirit and scope of the invention. For example, whilst in the described embodiment a linear ramp frequency modulation waveform is used, any arbitrary waveform could be readily substituted for the linear ramp in accordance with the particular requirements of the system. Further, it is to be appreciated that various components of the above-discussed circuitry in the embodiment could be appropriately modified in accordance with design requirements of the system, if desired, whilst providing the same inventive technical effect.

The invention claimed is:

1. A swept frequency source comprising a phase-locked loop frequency synthesiser, the phase-locked loop including:
    a voltage-controlled oscillator;
    means for generating a first swept waveform;
    means for modulating the voltage-controlled oscillator with the first swept frequency waveform added to a loop correction signal;
    a reference frequency source;
    a frequency/phase discriminator means for generating an output voltage which by means of a loop filter forms the loop correction signal so controlling the voltage-controlled oscillator, the frequency/phase discriminator means having a first input for receiving an input from the reference frequency source and a second input;
    means for generating a lineariser IF signal whose frequency is in a predetermined relationship to the instantaneous output frequency of the voltage-controlled oscillator; and
    feedback path means for feeding back the lineariser IF signal comprising:
        an input for receiving the lineariser IF signal;
        prescaler means for dividing the lineariser IF signal by a fixed number; and
        a means for applying the prescaled lineariser IF signal to the second input of the frequency/phase discriminator means.

2. A swept frequency source as claimed in claim 1, in which the swept frequency waveform comprises a linear ramp waveform arranged to generate a voltage-controlled oscillator output frequency whose frequency changes by equal increments in equal intervals of time, and in which frequency reference means provides a linear frequency ramp by means of direct digital synthesis the source further comprising:
    means to repetitively generate digital words, each digital word representing the desired instantaneous amplitude of the prescaled lineariser IF at each respective predetermined instant of time;
    accumulator means providing frequency words in an arithmetic progression, said accumulator means arranged to add an instantaneous frequency word with the cumulative sum of at least some of the immediately-preceding words to produce a digital sum phase word representing a new cumulative sum to which the next instantaneous value can be added; and
    a cosine look-up table arranged to be addressed by at least part of the digital sum phase word, the look-up table output contributing to said reference frequency output via a low pass filter.

3. A swept frequency source as claimed in claim 1, wherein the predetermined relationship between the voltage-controlled oscillator output frequency and the lineariser IF signal frequency is achieved by means of down conversion by means of a mixer and a stable local oscillator.

4. A swept frequency source as claimed in claim 1, wherein the predetermined relationship between the voltage-controlled oscillator output frequency and the lineariser IF signal frequency is achieved by means of frequency division by means of a prescaling frequency divider stage.

5. A swept frequency source as claimed in claim 1, wherein a linearly ramping voltage generator for providing linear frequency ramp synthesis is operable to apply a modulation signal to the frequency control input of the voltage-controlled oscillator via a summer component.

6. A method of generating a swept frequency using a phase-locked loop frequency synthesiser comprising the steps of
    (a) providing a phase-locked loop comprising a reference frequency source, a frequency/phase discriminator, a voltage-controlled oscillator, a prescaled lineariser IF signal whose frequency has a predetermined relationship to the output frequency of the voltage-controlled oscillator;
    (b) modulating the voltage-controlled oscillator output frequency with a first modulating waveform;
    (c) using the prescaled lineariser IF signal and the reference frequency source signal to produce a control signal whose instantaneous amplitude represents the phase difference between the prescaled lineariser IF signal and the reference frequency source signal;
    (d) applying the control signal to a loop filter to provide an output signal; and
    (e) summing said output signal with the first modulating waveform to control the voltage-controlled oscillator.

7. A method as claimed in claim 6, wherein the predetermined relationship between the voltage-controlled oscillator output frequency and the lineariser IF signal frequency is achieved by means of down conversion by means of a mixer and a stable local oscillator.

8. A method as claimed in claim 6, wherein the predetermined relationship between the voltage-controlled oscillator output frequency and the lineariser IF signal frequency is achieved by means of frequency division by means of a prescaling frequency divider stage.

9. A method as claimed in claim 6, further comprising the steps of generating a linearly ramping voltage using sweep waveform generating means in such a way as to apply a modulation signal to the frequency control input of the voltage-controlled oscillator via a summer component.

10. A swept frequency source as claimed in claim 1, further comprising a high roll-off low pass filter for removing all digitally-generated alias components.

11. A swept frequency source as claimed in claim 10, further comprising means for generating a direct current (dc) component, said dc component is a function of a frequency slip between the prescaled lineariser IF signal and the output of the high roll-off low pass filter.

12. A swept frequency source as claimed in claim 1, further comprising a loop filter for limiting correction bandwith and for setting a damping factor of the loop for optimal noise performance.

* * * * *